United States Patent
Douglis et al.

(10) Patent No.: US 8,135,683 B2
(45) Date of Patent: Mar. 13, 2012

(54) METHOD AND APPARATUS FOR DATA REDUNDANCY ELIMINATION AT THE BLOCK LEVEL

(75) Inventors: Frederick Douglis, Basking Ridge, NJ (US); Purushottam Kulkarni, Amherst, MA (US); Jason D. LaVoie, Mahopac, NY (US); John Michael Tracey, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 1801 days.

(21) Appl. No.: 10/737,213

(22) Filed: Dec. 16, 2003

(65) Prior Publication Data

US 2005/0131939 A1   Jun. 16, 2005

(51) Int. Cl.
*G06F 7/22* (2006.01)
*G06F 17/30* (2006.01)

(52) U.S. Cl. ...................................... 707/693

(58) Field of Classification Search ............... 707/1–10, 707/100–102, 104.1, 200–201, 693; 382/244–245; 341/51; 711/159; 709/203
See application file for complete search history.

(56) References Cited

U.S. PATENT DOCUMENTS

| | | | | |
|---|---|---|---|---|
| 5,850,565 A * | 12/1998 | Wightman | | 710/1 |
| 5,933,360 A * | 8/1999 | Larson | | 708/512 |
| 6,181,822 B1 * | 1/2001 | Miller et al. | | 382/232 |
| 6,301,394 B1 * | 10/2001 | Trout | | 382/244 |
| 6,374,250 B2 * | 4/2002 | Ajtai et al. | | 707/101 |
| 6,396,420 B1 * | 5/2002 | Augustine | | 341/50 |
| 6,526,174 B1 * | 2/2003 | Graffagnino | | 382/236 |
| 6,611,213 B1 * | 8/2003 | Bentley et al. | | 341/51 |
| 6,745,194 B2 * | 6/2004 | Burrows | | 707/101 |
| 6,889,297 B2 * | 5/2005 | Krapp et al. | | 711/159 |
| 6,898,332 B2 * | 5/2005 | Matsuhira | | 382/284 |
| 6,912,318 B2 * | 6/2005 | Kajiki et al. | | 382/239 |
| 6,925,467 B2 * | 8/2005 | Gu et al. | | 707/101 |
| 6,970,476 B1 * | 11/2005 | Jonsson et al. | | 370/401 |
| 7,031,972 B2 * | 4/2006 | Ren et al. | | 707/101 |
| 7,050,639 B1 * | 5/2006 | Barnes et al. | | 382/239 |
| 2002/0107866 A1 * | 8/2002 | Cousins et al. | | 707/102 |
| 2003/0085823 A1 * | 5/2003 | Lee | | 341/76 |
| 2003/0212653 A1 * | 11/2003 | Pulst et al. | | 707/1 |
| 2004/0174276 A1 * | 9/2004 | McCanne et al. | | 341/50 |
| 2004/0199669 A1 * | 10/2004 | Riggs et al. | | 709/242 |

OTHER PUBLICATIONS

Tolia et al., "Opportunistic use of Content Addressable Storage for Distributed File Systems", 2003 USENIX Annual Technical Conference, San Antonio, Texas, Jun. 9-14, 2003, pp. 127-140.

Douglis et al., "Application-specific Delta-encoding via Resemblance Detection", 2003 USENIX Annual Technical Conference, pp. 1-14.

USENIX Association, "Proceedings of HotOS IX: The $9^{th}$ Workshop on Hot Topics in Operating Systems", Lihue, Hawaii, USA, May 18-21, 2003, pp. 13-18.

* cited by examiner

*Primary Examiner* — James Trujillo
*Assistant Examiner* — Jorge A Casanova
(74) *Attorney, Agent, or Firm* — Yee & Associates, P.C.; William Stock

(57) ABSTRACT

A redundancy elimination mechanism is provided, which applies aspects of duplicate block elimination and delta encoding at the block level. The redundancy elimination mechanism divides file objects into content-defined blocks or "chunks." Identical chunks are suppressed. The redundancy elimination mechanism also performs resemblance detection on remaining chunks to identify chunks with sufficient redundancy to benefit from delta encoding of individual chunks. Any remaining chunks that do not benefit from delta encoding are compressed. Resemblance detection is optimized by merging groups of fingerprints into super fingerprints. This merging can be constructed to ensure that if two objects have a single super fingerprint in common, they are extremely likely to be substantially similar.

31 Claims, 6 Drawing Sheets

METHOD AND APPARATUS FOR DATA REDUNDANCY ELIMINATION AT THE BLOCK LEVEL

BACKGROUND OF THE INVENTION

1. Technical Field

The present invention relates to data processing and, in particular, to size reduction of files or objects in a data processing system. Still more particularly, the present invention provides a method, apparatus, and program for data redundancy elimination at the block level.

2. Description of Related Art

Despite increasing capacities of storage systems and network links, there are often benefits to reducing the size of file objects that are stored and/or transmitted. Examples of environments that would see such benefits include mobile devices with limited storage, communication over telephone links, or storage of reference data, which is data that is written, saved permanently, and often never again accessed. Other examples include wide-area transfers of large objects, such as scientific data sets, or over saturated links. The present invention is concerned with self-contained storage systems, in which all data is stored in a single location. Data can take the form of files in a file system, objects in a database, or other storage, and the terms "object," "file," and "file object" are used interchangeably in this document.

Numerous techniques for reducing large object sizes exist including data compression, duplicate suppression, and delta encoding. Data compression is the elimination of redundancy internally within an object. Duplicate suppression is the process of eliminating redundancy caused by identical objects. Delta encoding eliminates redundancy of an object relative to another object, which may be an earlier version of the object having the same name.

Another technique involves a method for dividing larger objects into smaller, variable-sized "chunks" and eliminating duplicate chunks. The boundaries of the chunks may determined, for example, using a function called a Rabin fingerprint over a sliding window of the content. The Rabin fingerprint is only one such solution and other techniques may be used to efficiently and deterministically hash the content. Such content-defined blocks isolate changes within an object, so that changes in one part of an object do not affect other parts and duplication of blocks of content across objects can be detected. This technique was first proposed for the low-bandwidth file system (LBFS) and has since been applied to other systems.

FIG. 1 illustrates a process of dividing objects into blocks and duplicate blocks. File object 110 is divided into a plurality of content-defined blocks or "chunks" 120. The process then compares the chunks and removes exact matches, replacing each duplicate chunk with a reference to an identical chunk 132 in the plurality of chunks 130. By replacing duplicate chunks with references to identical chunks, the size of the file object is reduced. However, the LBFS technique requires chunks to be identical. If one byte is different between two chunks, no benefit is realized between those two chunks. Thus, an object that has many minor changes scattered throughout may see no improvements whatsoever from the LBFS technique.

Yet another technique is known as delta encoding via resemblance detection (DERD). This technique attempts to extend delta encoding by identifying similar objects that may otherwise have no association, either spatial or temporal, with the object being encoded. The technique then performs delta encoding of the object against a chosen similar object. The resemblance detection step typically uses Rabin fingerprints to compute a set of values based on the contents of the object and then deterministically select a small number of these values to represent each object. Two objects with many of these fingerprints in common are likely to have much of their content in common overall.

FIG. 2 illustrates a process of delta encoding via resemblance detection. File objects 202 and 204 share common content. The process performs resemblance detection and delta encodes object 204 relative to object 202. The process results in a delta encoded file object 214. By replacing objects with delta encoded objects, a reduction in object size is realized. However, the performance of the DERD technique does not scale well with large datasets, because the resemblance detection step uses a quadratic algorithm which can suffer a performance penalty with large datasets. DERD also does not detect multiple objects when the objects match different parts of the encoded object. For example, if file A consists of the concatenation of files B-Z, then each file B-Z closely resembles a portion of file A; however, DERD is not capable of detecting the resemblance, because the fingerprints of each file B-Z would intersect only a small portion of the fingerprints of file A.

Another technique is an optimization of the Rsync protocol. Rsync allows two versions of a file to be synchronized across a slow link by sending hashes of blocks of content and identifying when one copy has the same blocks as the other, possibly offset between the two copies. A multi-round version of Rsync has been devised, which tries large blocks and then decomposes them into smaller blocks to find pieces that are similar enough to delta encode.

SUMMARY OF THE INVENTION

The present invention recognizes the disadvantages of the prior art and provides a redundancy elimination mechanism, which applies aspects of duplicate block elimination and delta encoding at the block level. The redundancy elimination mechanism of the present invention realizes benefits in both spatial reduction and performance. The redundancy elimination mechanism divides file objects into blocks or "chunks." These chunks may be content-defined blocks or fixed-length blocks. Identical chunks are suppressed. The redundancy elimination mechanism also performs resemblance detection on remaining chunks to identify chunks with sufficient redundancy to benefit from delta encoding of individual chunks. Any remaining chunks that do not benefit from delta encoding are compressed. Resemblance detection is optimized by merging groups of fingerprints into super fingerprints. This merging can be constructed to ensure that if two objects have a single super fingerprint in common, they are extremely likely to be within a specified threshold of similarity.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
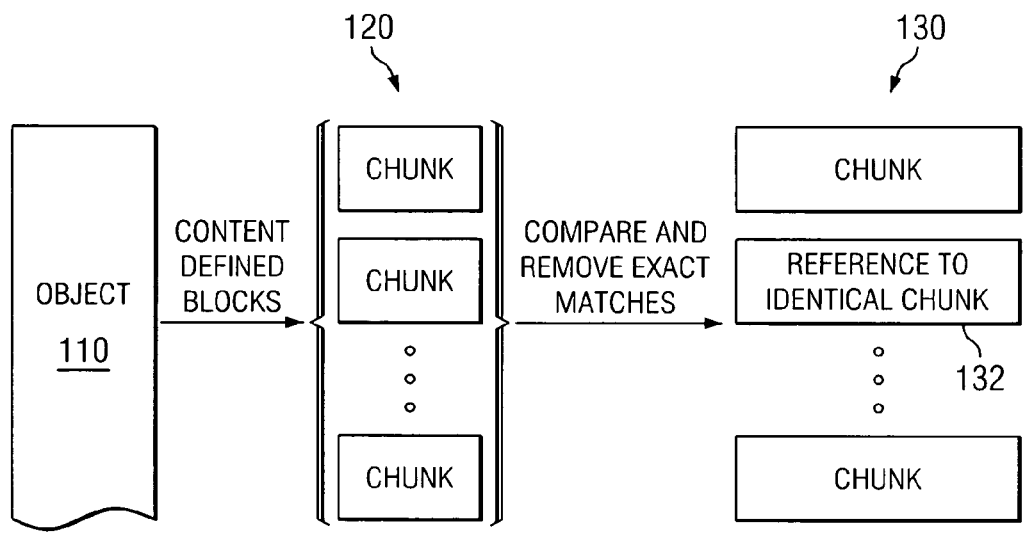
FIG. 1 illustrates a process of dividing objects into blocks and duplicate blocks.
Figure 2:
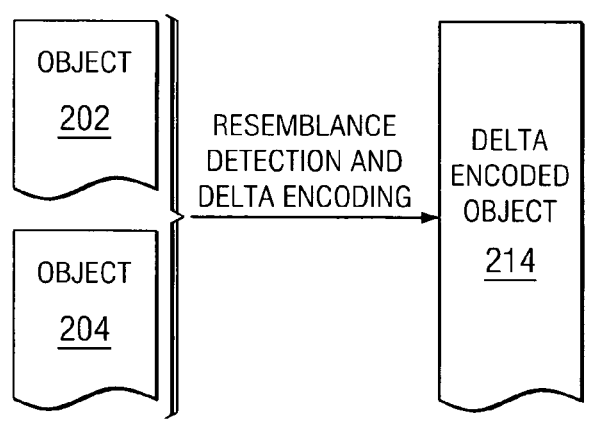
FIG. 2 illustrates a process of delta encoding via resemblance detection.
Figure 3:
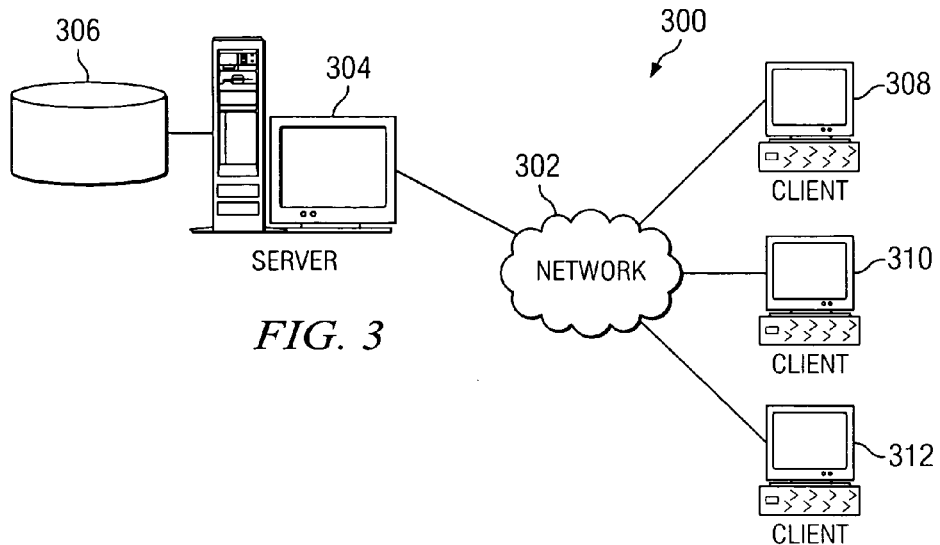
FIG. 3 depicts a pictorial representation of a network of data processing systems in which the present invention may be implemented.

With reference now to the figures, FIG. 3 depicts a pictorial representation of a network of data processing systems in which the present invention may be implemented. Network data processing system 300 is a network of computers in which the present invention may be implemented. Network data processing system 300 contains a network 302, which is the medium used to provide communications links between various devices and computers connected together within network data processing system 300. Network 302 may include connections, such as wire, wireless communication links, or fiber optic cables.

In the depicted example, server 304 is connected to network 302 and provides access to storage unit 306. Storage unit 306 may be a self-contained system, such as, for example, a hard drive, a backup system, a storage area network (SAN), etc. In addition, clients 308, 310, and 312 are connected to network 302. These clients 308, 310, and 312 may be, for example, personal computers or network computers. In the depicted example, server 304 provides data, such as boot files, operating system images, and applications to clients 308-312. Clients 308, 310, and 312 are clients to server 304. Network data processing system 300 may include additional servers, clients, and other devices not shown.

In accordance with a preferred embodiment of the present invention, devices in network data processing system 300 include a mechanism for redundancy elimination at the block level (REBL). For example, server 304 may store reference data, which is written and permanently saved but may not be accessed again. In this case, server 304 may benefit by reducing the size of file objects that are stored in storage unit 306. As another example, one of clients 308-312 may have limited storage capacity. As a specific example, a client may be a mobile computing device with a small hard drive or flash memory for permanent storage. In such an instance, the client device may benefit from reduced object size.

The redundancy elimination mechanism of the present invention applies aspects of duplicate block elimination and delta encoding at the block level. The redundancy elimination mechanism divides file objects into blocks or "chunks." The chunks may be content-defined blocks or fixed-length blocks. Identical chunks are suppressed. The redundancy elimination mechanism also performs resemblance detection on remaining chunks to identify chunks with sufficient redundancy to benefit from delta encoding of individual chunks. Any chunks that do not benefit from delta encoding are compressed. Resemblance detection is optimized by merging groups of fingerprints into super fingerprints. This merging can be constructed to ensure that if two objects have a single super fingerprint in common, they are extremely likely to be within a specified threshold of similarity. Objects are substantially similar if they are similar enough to benefit from delta encoding.

In the depicted example, network data processing system 300 is the Internet with network 302 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, government, educational and other computer systems that route data and messages. Of course, network data processing system 300 also may be implemented as a number of different types of networks, such as for example, an intranet, a local area network (LAN), or a wide area network (WAN). FIG. 3 is intended as an example and not as an architectural limitation for the present invention.

Figure 4:
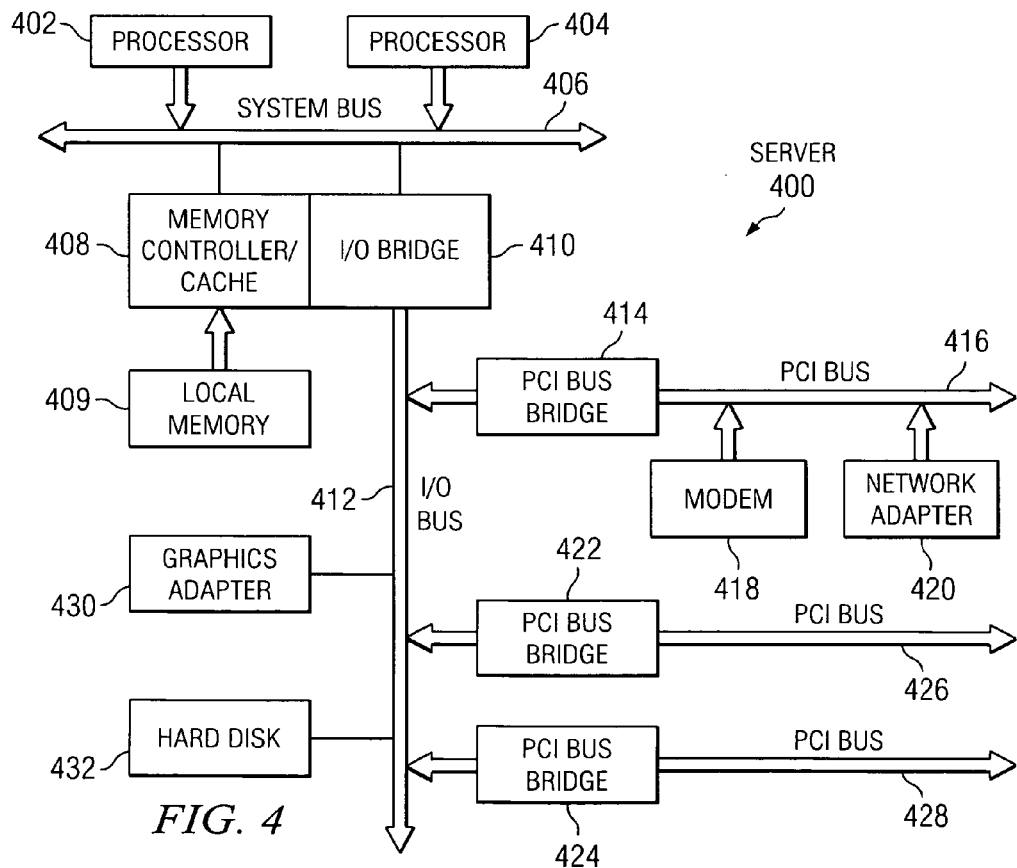
FIG. 4 is a block diagram of a data processing system that may be implemented as a server in accordance with a preferred embodiment of the present invention.

Referring to FIG. 4, a block diagram of a data processing system that may be implemented as a server, such as server 304 in FIG. 3, is depicted in accordance with a preferred embodiment of the present invention. Data processing system 400 may be a symmetric multiprocessor (SMP) system including a plurality of processors 402 and 404 connected to system bus 406. Alternatively, a single processor system may be employed. Also connected to system bus 406 is memory controller/cache 408, which provides an interface to local memory 409. I/O bus bridge 410 is connected to system bus 406 and provides an interface to I/O bus 412. Memory controller/cache 408 and I/O bus bridge 410 may be integrated as depicted.

Peripheral component interconnect (PCI) bus bridge 414 connected to I/O bus 412 provides an interface to PCI local bus 416. A number of modems may be connected to PCI local bus 416. Typical PCI bus implementations will support four PCI expansion slots or add-in connectors. Communications links to clients 308-312 in FIG. 3 may be provided through modem 418 and network adapter 420 connected to PCI local bus 416 through add-in connectors.

Additional PCI bus bridges 422 and 424 provide interfaces for additional PCI local buses 426 and 428, from which additional modems or network adapters may be supported. In this manner, data processing system 400 allows connections to multiple network computers. A memory-mapped graphics adapter 430 and hard disk 432 may also be connected to I/O bus 412 as depicted, either directly or indirectly.

Those of ordinary skill in the art will appreciate that the hardware depicted in FIG. 4 may vary. For example, other peripheral devices, such as optical disk drives and the like, also may be used in addition to or in place of the hardware depicted. The depicted example is not meant to imply architectural limitations with respect to the present invention.

The data processing system depicted in FIG. 4 may be, for example, an IBM eServer pSeries system, a product of International Business Machines Corporation in Armonk, N.Y., running the Advanced Interactive Executive (AIX) operating system or Linux operating system. "eServer and "pSeries" are trademarks of International Business Machines Corporation.

Figure 5:
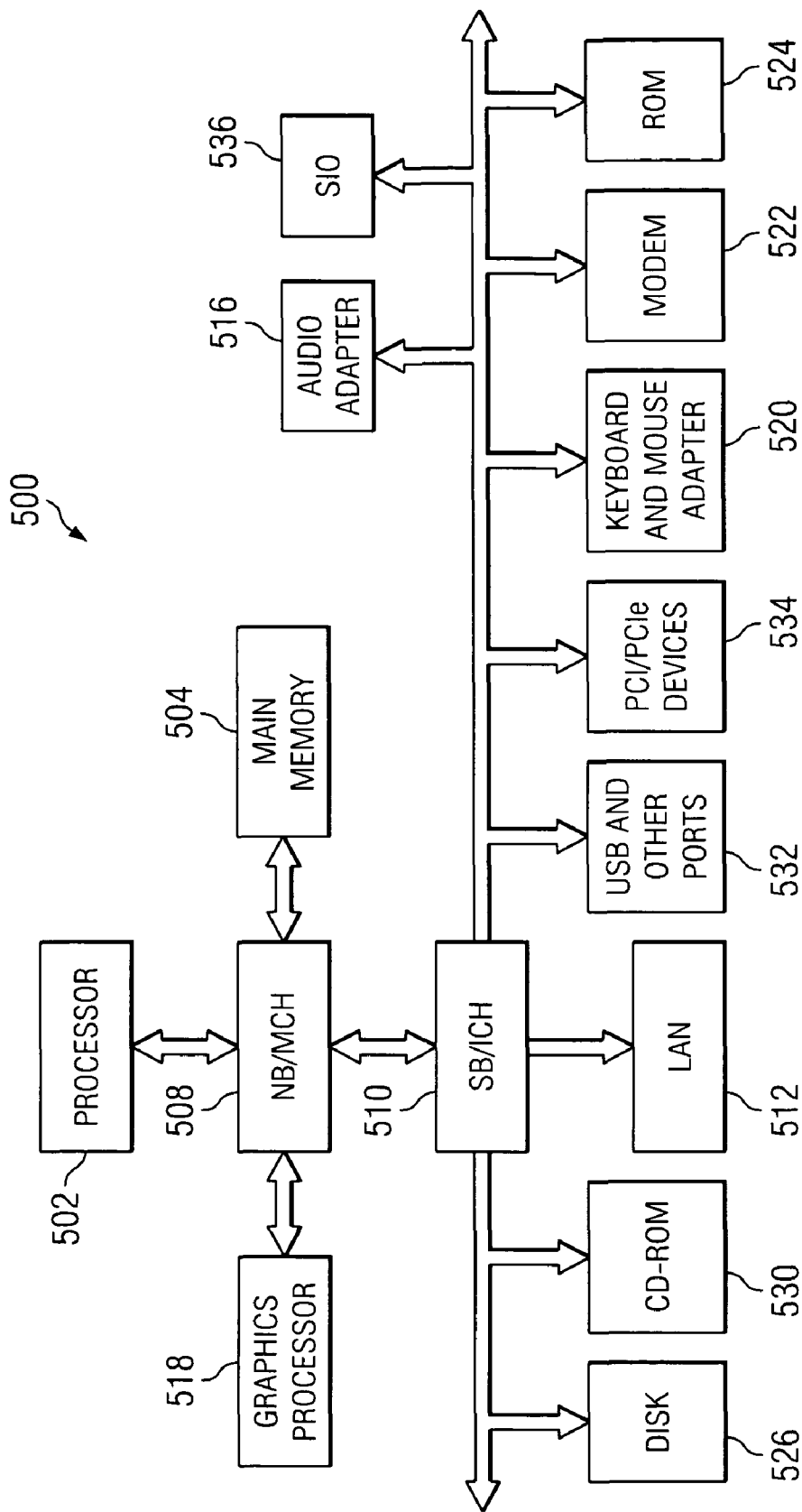
FIG. 5 is a block diagram of a data processing system in which the present invention may be implemented.

With reference now to FIG. 5, a block diagram of a data processing system is shown in which the present invention may be implemented. Data processing system 500 is an example of a computer, such as client 308 in FIG. 3, in which code or instructions implementing the processes of the present invention may be located. In the depicted example, data processing system 500 employs a hub architecture including a north bridge and memory controller hub (MCH) 508 and a south bridge and input/output (I/O) controller hub (ICH) 510. Processor 502, main memory 504, and graphics processor 518 are connected to MCH 508. Graphics processor 518 may be connected to the MCH through an accelerated graphics port (AGP), for example.

In the depicted example, local area network (LAN) adapter 512, audio adapter 516, keyboard and mouse adapter 520, modem 522, read only memory (ROM) 524, hard disk drive (HDD) 526, CD-ROM driver 530, universal serial bus (USB) ports and other communications ports 532, and PCI/PCIe devices 534 may be connected to ICH 510. PCI/PCIe devices may include, for example, Ethernet adapters, add-in cards, PC cards for notebook computers, etc. PCI uses a cardbus controller, while PCIe does not. ROM 524 may be, for example, a flash binary input/output system (BIOS). Hard disk drive 526 and CD-ROM drive 530 may use, for example, an integrated drive electronics (IDE) or serial advanced technology attachment (SATA) interface. A super I/O (SIO) device 536 may be connected to ICH 510.

An operating system runs on processor 502 and is used to coordinate and provide control of various components within data processing system 500 in FIG. 5. The operating system may be a commercially available operating system such as Windows XP, which is available from Microsoft Corporation. "Windows XP" is a trademark of Microsoft Corporation. An object oriented programming system such as Java may run in conjunction with the operating system and provides calls to the operating system from Java programs or applications executing on data processing system 500. "Java" is a trademark of Sun Microsystems, Inc. Instructions for the operating system, the object-oriented programming system, and applications or programs are located on storage devices, such as hard disk drive 526, and may be loaded into main memory 504 for execution by processor 502. The processes of the present invention are performed by processor 502 using computer implemented instructions, which may be located in a memory such as, for example, main memory 504, memory 524, or in one or more peripheral devices 526 and 530.

Those of ordinary skill in the art will appreciate that the hardware in FIG. 5 may vary depending on the implementation. Other internal hardware or peripheral devices, such as flash memory, equivalent non-volatile memory, or optical disk drives and the like, may be used in addition to or in place of the hardware depicted in FIG. 5. Also, the processes of the present invention may be applied to a multiprocessor data processing system.

Figure 6A:
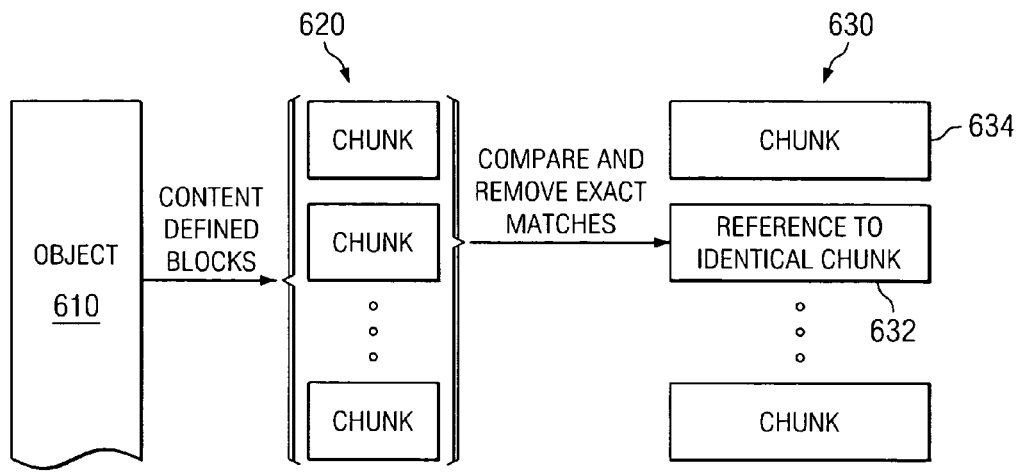
FIGS. 6A-6C are block diagrams illustrating the operation of a redundancy elimination mechanism in accordance with a preferred embodiment of the present invention.
Figure 6B:
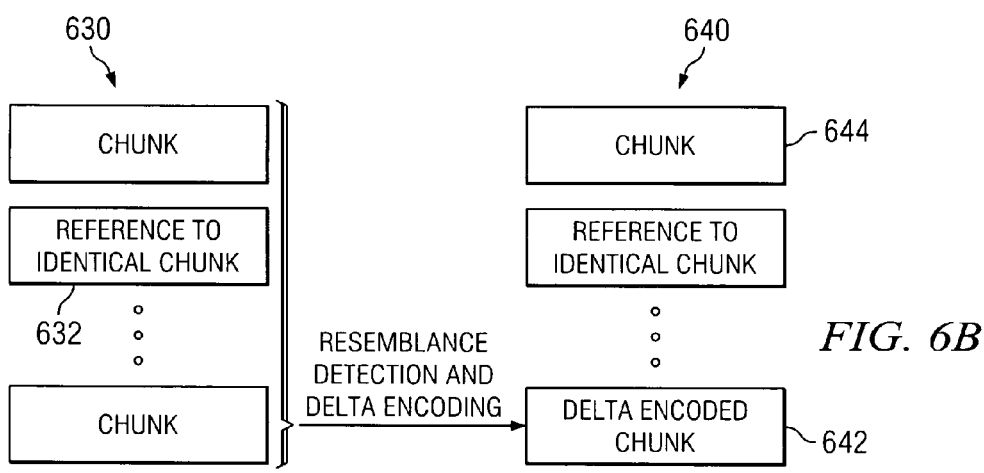
Figure 6C:
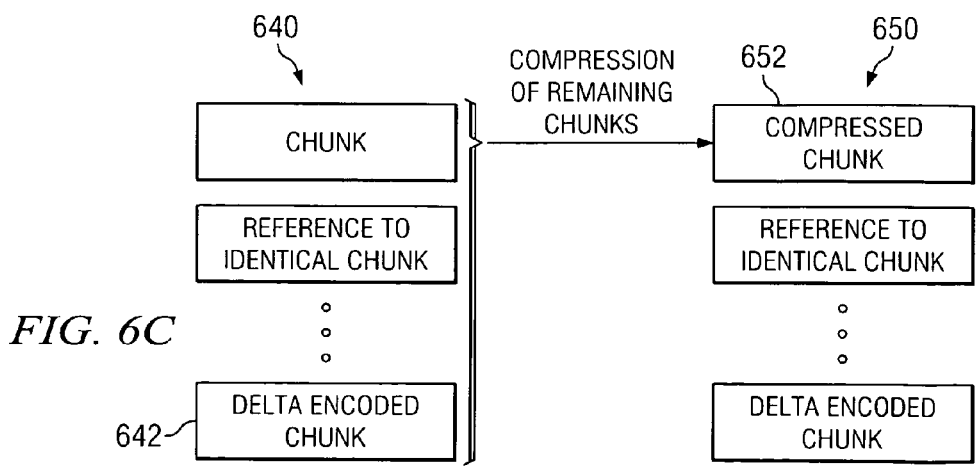

FIGS. 6A-6C are block diagrams illustrating the operation of a redundancy elimination mechanism in accordance with a preferred embodiment of the present invention. More particularly, with reference to FIG. 6A, file object 610 is divided into "chunks" 620. These chunks are variable-sized and content defined. The redundancy elimination mechanism uses a method such as Rabin fingerprints to determine chunk boundaries in an object. A Rabin fingerprint of a data chunk is computed by performing a polynomial modulo of the chunk with a predetermined irreducible polynomial. A Rabin fingerprint is computed for overlapping portions of the file. When the fingerprint has certain characteristics, such as its low-order bits equaling a constant value, the bytes producing that fingerprint constitute the end of a chunk, called a breakpoint. Rabin fingerprints are efficient for computing on a moving window in a file, thereby making it easy to incrementally scan and divide the object into chunks.

The redundancy elimination mechanism of the present invention then compares the chunks and removes exact matches. Chunks that are identical to other chunks are replaced with a reference to the identical chunk 632 in the resulting set of chunks 630. For instance, in the example shown in FIG. 6A, the reference to identical chunk 632 may refer to chunk 634 or another chunk not shown in the illustrated example. Note also that fixed-sized chunks or blocks may be used instead of variable-sized content defined blocks. In some systems, fixed-sized blocks may result in comparable benefits with somewhat lower overhead; however, in most cases, fixed-sized blocks are expected to detract from the benefits of redundancy elimination.

With reference now to FIG. 6B, the redundancy elimination mechanism performs resemblance detection on the remaining chunks in the set of chunks 630. Rabin fingerprints are normally computed at the time chunks are defined. These Rabin fingerprints may be used to identify content features in each chunk. Thus, each chunk may have a plurality of associated fingerprints. Resemblance detection determines the number of matching features in the chunks. This predetermined number may be received from an operator, a configuration file, a program constant, or other ways. Resemblance detection may consist of counting the number of matching fingerprints between objects. If two chunks have a predetermined number of matching fingerprints, the chunks are determined to be substantially similar or, in other words, similar enough to benefit from delta encoding. However, other techniques for identifying substantially similar chunks may also be used within the scope of the present invention.

Delta encoding consists of storing the differences of one chunk relative to a chosen similar chunk, called a reference chunk. Substantially similar chunks are replaced in the set of chunks 640 with a delta encoded chunk 642. Since a delta encoded chunk stores only the differences between similar chunks, the size of a delta encoded chunk will be significantly less than the original chunk. In the example depicted in FIG. 6B, the delta encoded chunk 642 may be encoded relative to chunk 644 or another chunk not shown in the illustrated example.

Turning to FIG. 6C, the redundancy elimination mechanism compresses any remaining chunks in the set of chunks 640. Any chunks that are not identical to other chunks and do not benefit from delta encoding are compressed using traditional techniques. In the example shown in FIG. 6C, compressed chunk 652 results in the set of chunks 650. Therefore, the redundancy elimination mechanism of the present invention realizes the benefits of duplicate block suppression, resemblance detection and delta encoding, and traditional compression techniques.

Figure 7A:
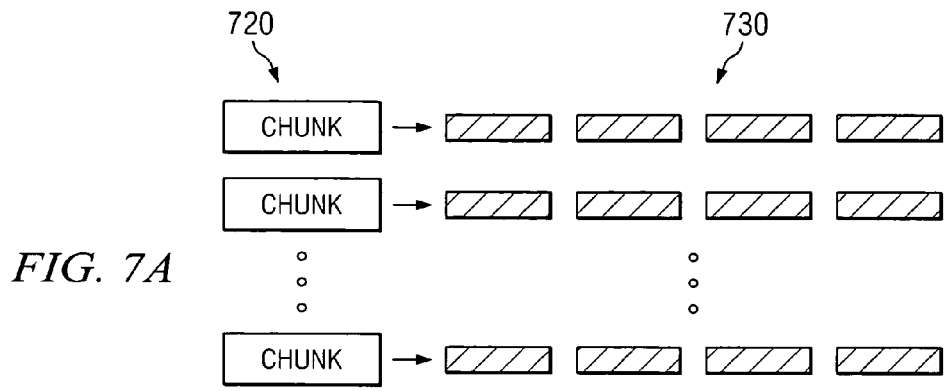
FIGS. 7A and 7B are block diagrams illustrating the computation of fingerprints for chunks in accordance with a preferred embodiment of the present invention.
Figure 7B:
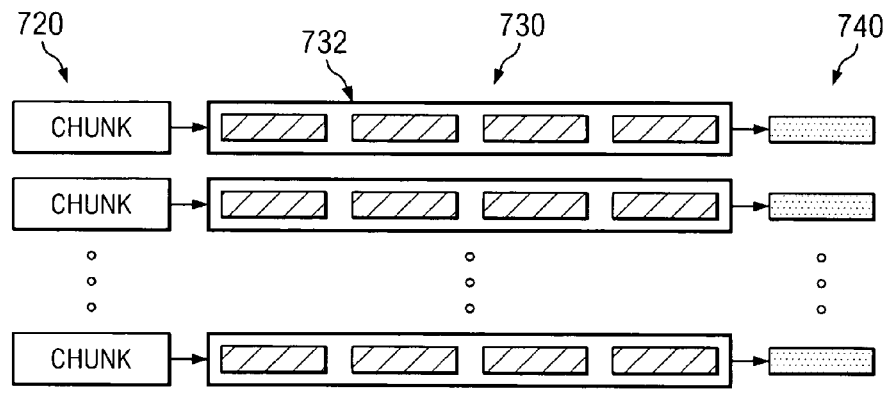

FIGS. 7A and 7B are block diagrams illustrating the computation of fingerprints for chunks in accordance with a preferred embodiment of the present invention. More particularly, with reference to FIG. 7A, an object is divided into a set of chunks 720. A plurality of fingerprints 730 is computed for the chunks with each chunk having a plurality of fingerprints corresponding to features of the chunk. Resemblance detection may consist of counting the number of matching fingerprints between objects. If two chunks have a predetermined number of matching fingerprints, the chunks are determined to be substantially similar or, in other words, similar enough to benefit from delta encoding.

With reference now to FIG. 7B, an object is divided into a set of chunks 720. A plurality of fingerprints 730 is computed for the chunks with each chunk having a plurality of fingerprints corresponding to features of the chunk. The plurality of fingerprints for a chunk are merged together into a fingerprint group, such as group 732. A super fingerprint is then calculated for each fingerprint group, resulting in super fingerprints 740. An exemplary embodiment of the super fingerprint calculation is to concatenate each fingerprint and compute a hash of the concatenated fingerprints, for instance with an MD5 hash, producing a fixed-size 128-bit super fingerprint. Each chunk may then have one or more super fingerprints.

There are a number of details that are important to the efficient and effective use of the redundancy elimination technique of the present invention. For example, the size of a chunk must be optimized. Smaller chunks increase the rate of similar chunks being identified. However, smaller chunks increase the overhead both in storing the fingerprints and in performing resemblance detection computations. Smaller chunks also decrease the possible benefit of simple compression. Furthermore, a method for determining a reference block for delta encoding must be decided upon. For example, a reference block may be selected when it matches the greatest number of matching features of any candidate reference block. Alternatively, the first reference block to match N super fingerprints of another block can be used as its reference block.

In addition, the number of fingerprints to be clustered into a super fingerprint must be determined. If there are many fingerprints incorporated into each super fingerprint, then if two objects have a single super fingerprint in common, they are very likely to be substantially similar. The fewer fingerprints there are per super fingerprint, the less accurate the resemblance detection, but having too many fingerprints in each super fingerprint can lead to identifying fewer similar blocks and lower overall savings. By having fewer fingerprints per super fingerprint, the likely amount of similarity decreases. Therefore, a balance between accuracy (effectiveness) and performance (efficiency) must be resolved.

Figure 8:
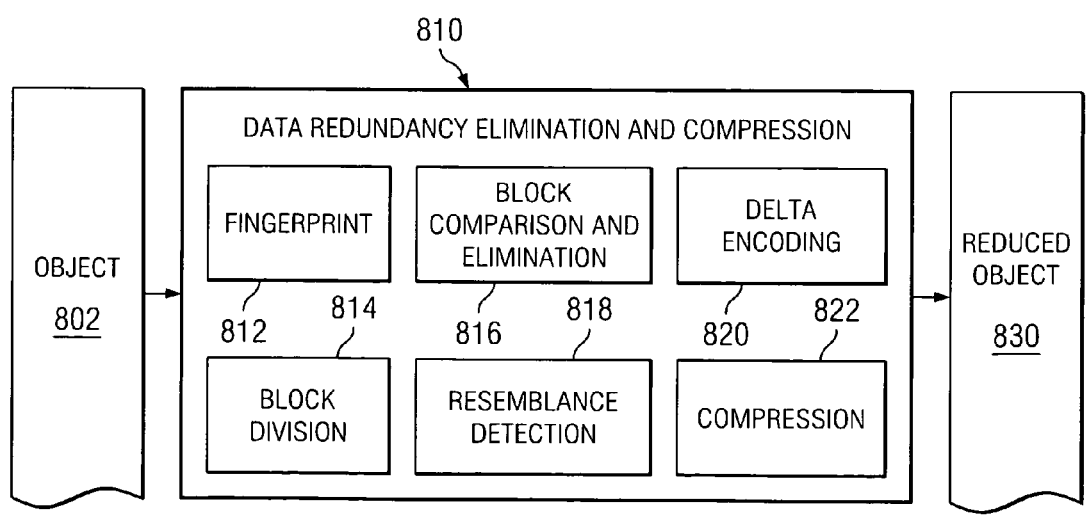
FIG. 8 is a diagram illustrating a data redundancy elimination and compression mechanism in accordance with a preferred embodiment of the present invention.

FIG. 8 is a diagram illustrating a data redundancy elimination and compression mechanism in accordance with a preferred embodiment of the present invention. File object 802 is provided to data redundancy elimination and compression mechanism 810. The data redundancy elimination and compression mechanism includes fingerprint module 812, which calculates fingerprints that are used to divide the object into chunks and to define features within each chunk. Fingerprint module 812 may also generate super fingerprints for groups of fingerprints.

Block division module 814 divides the object into blocks or "chunks." The object may be divided into fixed-sized blocks or variable-sized blocks. Dividing the object into fixed-sized blocks may avoid a performance penalty, particularly at the time of division. Fixed-sized blocks may also suffer a performance penalty when determining resemblance, however. Variable-sized content defined blocks or "chunks" may result in a higher likelihood of identical and/or substantially similar chunks being detected. Block division module 814 may divide object 802 into variable-sized content defined chunks using fingerprints generated by fingerprint module 812.

Block comparison and elimination module 816 compares blocks to identify identical blocks. Blocks that are identical to other blocks are replaced with a reference to another reference block. Resemblance detection module 818 performs resemblance detection computations to identify blocks that are substantially similar or, in other words, similar enough to benefit from delta encoding. The resemblance detection module may, for example, count the number of fingerprints that blocks have in common. Alternatively, the resemblance detection module determines whether blocks have matching super fingerprints. Blocks that have a predetermined number of features in common are determined to be substantially similar. Delta encoding module 820 performs delta encoding on a chunk, storing differences between the chunk and a reference chunk. These delta encoded chunk replaces the original chunk, thus reducing the storage or transmission size. The delta encoding module may increase the number of blocks that are delta-encoded using heuristics, such as first-fit versus best-fit, to increase the overall effectiveness.

The compression module 822 performs compression on any remaining chunks. The compression module may use any known compression techniques to compress the size of individual blocks. The resulting object, reduced object 830, is a set of references to identical blocks, delta encoded blocks, and compressed blocks. In an exemplary embodiment, the compression module 822 may compress the object 802. If the compressed object has a smaller size than reduced object 830, the compressed object may be used for storage or transmission.

Figure 9A:
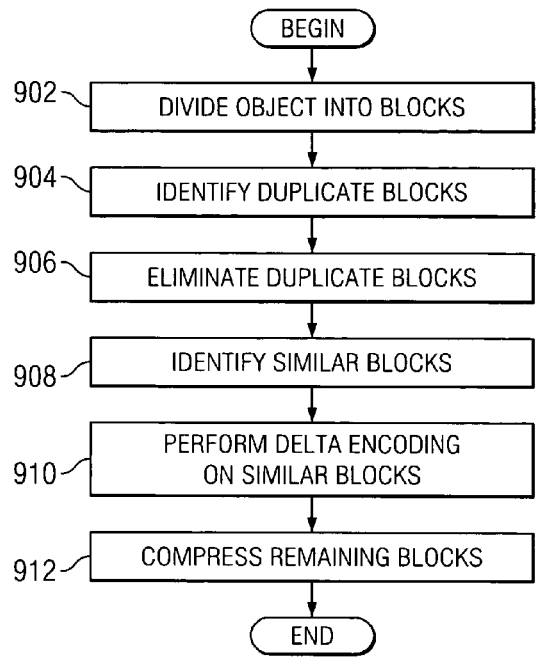
FIGS. 9A and 9B are flowcharts illustrating the operation of a redundancy elimination mechanism in accordance with a preferred embodiment of the present invention.
Figure 9B:
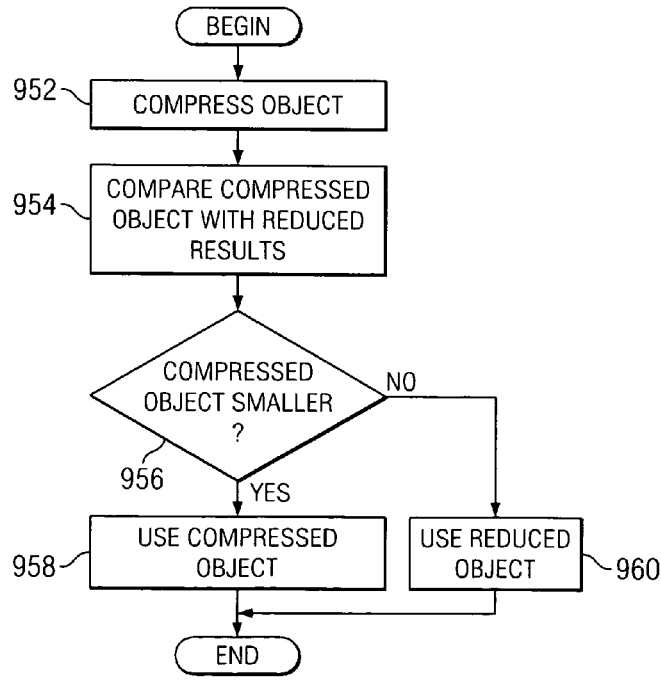

FIGS. 9A and 9B are flowcharts illustrating the operation of a redundancy elimination mechanism in accordance with a preferred embodiment of the present invention. More particularly, with reference to FIG. 9A, a process for performing redundancy elimination at the block level is illustrated. The process begins and divides the object into blocks (step 902). As stated above, the blocks may be fixed-sized blocks or content defined chunks. Then, the process identifies duplicate blocks (step 904) and eliminates duplicate blocks (step 906).

Thereafter, the process identifies similar blocks (step 908). The process then performs delta encoding on similar blocks (step 910) to form delta encoded blocks. The process compresses the remaining blocks that do not benefit from delta encoding (step 912) and ends.

Next, with reference to FIG. 9B, a process for determining whether to compress an object is illustrated. The process begins and compresses the object (step 952). The process then compares the size of the compressed object with the results of the reduced results from the reduction process shown in FIG. 9A (step 954). A determination is made as to whether the compressed object is smaller in size than the reduced results (step 956). If the compressed object is smaller, the process uses the compressed object (sep 958) and ends. However, if the object reduced by the reduction technique is smaller in step 956, the process uses the object resulting from the reduction process shown in FIG. 9A (step 960) and ends.

The process in FIG. 9B determines whether to use the compressed object based on the size of the compressed object relative to the results of the reduction technique shown in FIG. 9A. However, other measures of effectiveness may also be used. For example, whether compression will result in a greater speed of execution may be used as a measure of effectiveness.

Thus, the present invention solves the disadvantages of the prior art by providing a technique for redundancy elimination at the block level. The redundancy elimination mechanism of the present invention applies aspects of several techniques to attain benefits in both spatial reduction and performance. The redundancy elimination mechanism divides file objects into fixed-sized blocks or content-defined blocks or "chunks." Identical chunks are suppressed. The redundancy elimination mechanism also performs resemblance detection on remaining chunks to identify chunks with sufficient redundancy to benefit from delta encoding of individual chunks. Any remaining chunks that do not benefit from delta encoding are compressed. Resemblance detection is optimized by merging groups of fingerprints into super fingerprints. If two objects have a specific number of super fingerprints in common, they are extremely likely to be substantially similar.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for reducing the size of an object, the method comprising:
   dividing an object into a plurality of blocks, wherein each block of the plurality of blocks comprises a plurality of features, each of the plurality of features corresponding to one of a plurality of fingerprints;
   calculating a super fingerprint for each of the plurality of blocks to form a plurality of super fingerprints, wherein each of the set of the super fingerprints is calculated by merging ones of the plurality of fingerprints for a particular block of the plurality of blocks;
   responsive to dividing the object into the plurality of blocks, identifying identical blocks within the plurality of blocks;
   suppressing the identical blocks without differentially compressing the identical blocks;
   responsive to suppressing the identical blocks without differentially compressing the identical blocks, identifying similar blocks within the plurality of blocks;
   differentially compressing the similar blocks;
   performing data compression on at least one block within the plurality of blocks, wherein the at least one block is not differentially compressed, wherein the at least one block is not suppressed, and wherein the step of performing data compression on the at least one block forms a reduced object; and
   storing the reduced object in a computer storage readable media.

2. The method of claim 1, wherein the plurality of blocks are fixed in size.

3. The method of claim 1, wherein the plurality of blocks are variable in size and determined based on characteristics of content of the object.

4. The method of claim 1, further comprising:
   compressing the object to form a compressed object;
   comparing an effectiveness of the compressed object with an effectiveness of the reduced object; and
   using the compressed object if the effectiveness of the compressed object is greater than the effectiveness of the reduced object.

5. The method of claim 4, wherein effectiveness is measured by one of speed of execution and object size.

6. The method of claim 4, further comprising:
   using the reduced object if the effectiveness of the compressed object is less than the effectiveness of the reduced object.

7. The method of claim 1, wherein identifying similar blocks includes identifying one or more features of the plurality of blocks.

8. The method of claim 7, wherein identifying one or more features includes calculating one or more fingerprints for the plurality of blocks.

9. The method of claim 8, wherein identifying similar blocks further includes:
   merging the one or more fingerprints for the plurality of blocks to form one or more fingerprint groups;
   calculating super fingerprints for the one or more fingerprint groups; and
   comparing the super fingerprints to each other to determine common features among the super fingerprints.

10. The method of claim 7, wherein identifying similar blocks further includes:
    determining whether blocks have a specified number of matching features.

11. The method of claim 7, wherein identifying similar blocks further includes:
    identifying a reference block that matches a greatest number of features of remaining similar blocks.

12. The method of claim 7, wherein identifying similar blocks includes:
    using heuristics to identify similar blocks.

13. The method of claim 1, wherein the reduced object is transmitted over a network.

14. The method of claim 1, wherein the step of identifying identical blocks within the plurality of blocks further comprises:
    identifying identical blocks within the plurality of blocks, wherein identical blocks are identified when ones of the plurality of blocks have identical super fingerprints.

15. The method of claim 1, wherein the step of suppressing the identical blocks without differentially compressing the identical blocks further comprises:
    suppressing the identical blocks without differentially compressing the identical blocks, wherein the identical blocks are suppressed by replacing ones of the identical blocks with a reference to an identical block.

16. The method of claim 1, further comprising:
    responsive to suppressing the identical blocks without differentially compressing the identical blocks, identifying similar blocks within the plurality of blocks, wherein similar blocks are identified when the ones of the plurality of blocks have a predetermined number of matching fingerprints of their plurality of fingerprints; and
    responsive to identifying similar blocks within the plurality of blocks, selecting a reference block from the similar blocks.

17. The method of claim 16, wherein the step of differentially compressing the similar blocks further comprises:
    differentially compressing the similar blocks, wherein differentially compressing the similar blocks comprises performing delta encoding on the similar blocks in reference to the reference block.

18. A data processing apparatus for reducing the size of an object, the apparatus comprising:
- software instructions and hardware for executing the software instructions, wherein the software instructions further comprise:
- division means for dividing an object into a plurality of blocks, wherein each block of the plurality of blocks comprises a plurality of features, each of the plurality of features corresponding to one of a plurality of fingerprints;
- calculating means for calculating a super fingerprint for each of the plurality of blocks to form a plurality of super fingerprints, wherein each of the set of the super fingerprints is calculated by merging ones of the plurality of fingerprints for a particular block of the plurality of blocks;
- means, responsive to dividing the object into the plurality of blocks, for identifying identical blocks within the plurality of blocks;
- means for suppressing the identical blocks without differentially compressing the identical blocks;
- means, responsive to suppressing the identical blocks without differentially compressing the identical blocks, for identifying similar blocks within the plurality of blocks;
- means for differentially compressing the similar blocks;
- means for performing data compression on at least one block within the plurality of blocks, wherein the at least one block is not differentially compressed, wherein the at least one block is not suppressed, and wherein the means for performing data compression on the at least one block forms a reduced object; and
- means for storing the reduced object in a computer storage readable media.

19. The apparatus of claim 18, wherein the plurality of blocks are fixed in size.

20. The apparatus of claim 18, wherein the plurality of blocks are variable in size and determined based on characteristics of content of the object.

21. The apparatus of claim 18, further comprising:
- means for compressing the object to form a compressed object;
- means for comparing an effectiveness of the compressed object with an effectiveness of the reduced object; and
- means for using the compressed object if the effectiveness of the compressed object is greater than the effectiveness of the reduced object.

22. The apparatus of claim 21, wherein effectiveness is measured by one of speed of execution and object size.

23. The apparatus of claim 21, further comprising:
- means for using the reduced object if the effectiveness of the compressed object is less than the effectiveness of the reduced object.

24. The apparatus of claim 18, wherein the identification means includes means for identifying one or more features of the plurality of blocks.

25. The apparatus of claim 24, wherein the means for identifying one or more features includes means for calculating one or more fingerprints for the plurality of blocks.

26. The apparatus of claim 25, wherein the identification means further includes:
- means for merging the one or more fingerprints for the plurality of blocks to form one or more fingerprint groups;
- means for calculating super fingerprints for the one or more fingerprint groups; and
- means for comparing the super fingerprints to each other to determine common features among the super fingerprints.

27. The apparatus of claim 24, wherein the identification means further includes:
- means for determining whether blocks have a specified number of matching features.

28. The apparatus of claim 24, wherein identification means further includes:
- means for identifying a reference block that matches a greatest number of features of remaining similar blocks.

29. The apparatus of claim 18, wherein the reduced object is stored in a storage unit.

30. The apparatus of claim 18, wherein the reduced object is transmitted over a network.

31. A computer program product, in a non-transitory computer storage readable medium, for reducing the size of an object, the computer program product comprising:
- instructions for dividing an object into a plurality of blocks, wherein each block of the plurality of blocks comprises a plurality of features, each of the plurality of features corresponding to one of a plurality of fingerprints;
- instructions for calculating a super fingerprint for each of the plurality of blocks to form a plurality of super fingerprints, wherein each of the set of the super fingerprints is calculated by merging ones of the plurality of fingerprints for a particular block of the plurality of blocks
- instructions, responsive to dividing the object into the plurality of blocks, for identifying identical blocks within the plurality of blocks;
- instructions for suppressing the identical blocks without differentially compressing the identical blocks;
- instructions, responsive to suppressing the identical blocks without differentially compressing the identical blocks, for identifying similar blocks within the plurality of blocks;
- instructions for differentially compressing the similar blocks;
- instructions for performing data compression on at least one block within the plurality of blocks, wherein the at least one block is not differentially compressed, wherein the at least one block is not suppressed, and wherein the step of performing data compression on the at least one block forms a reduced object; and
- storing the reduced object in a computer storage readable media.

* * * * *